US008292023B2

(12) United States Patent
Slotte

(10) Patent No.: US 8,292,023 B2

(45) Date of Patent: Oct. 23, 2012

(54) ENCLOSING ADSORBENT MATERIAL

(75) Inventor: Thomas Benedict Slotte, Turku (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/378,349

(22) Filed: Feb. 13, 2009

(65) Prior Publication Data

US 2010/0206658 A1 Aug. 19, 2010

(51) Int. Cl.
*H05K 5/00* (2006.01)

(52) U.S. Cl. ........................................ 181/151; 181/148

(58) Field of Classification Search .................. 181/151, 181/148

See application file for complete search history.

(56) References Cited

U.S. PATENT DOCUMENTS

| | | | | |
|---|---|---|---|---|
| 2,797,766 | A | 7/1957 | Sullivan et al. | 181/31 |
| 4,004,094 | A | 1/1977 | Ott | 179/1 E |
| 4,101,736 | A | 7/1978 | Czerwinski | 179/1 E |
| 4,450,929 | A * | 5/1984 | Marrs | 181/146 |
| 4,657,108 | A * | 4/1987 | Ward | 181/151 |
| 4,869,340 | A | 9/1989 | Coudoux | 181/146 |
| 5,333,204 | A * | 7/1994 | Hamada et al. | 381/346 |
| 7,448,467 | B2 * | 11/2008 | Wright et al. | 181/149 |
| 2003/0062217 | A1 | 4/2003 | Sheng et al. | 181/290 |
| 2004/0251077 | A1 * | 12/2004 | Wright et al. | 181/151 |
| 2007/0195982 | A1 | 8/2007 | Saiki et al. | 381/345 |
| 2007/0286449 | A1 | 12/2007 | Matsumura et al. | 381/433 |
| 2008/0135327 | A1 * | 6/2008 | Matsumura et al. | 181/151 |
| 2008/0149418 | A1 | 6/2008 | Imamura et al. | 181/199 |
| 2008/0202844 | A1 * | 8/2008 | Leclear et al. | 181/148 |

FOREIGN PATENT DOCUMENTS

| | | | |
|---|---|---|---|
| DE | 195 03 193 | A1 | 8/1996 |
| EP | 0 040 063 | A1 | 11/1981 |
| EP | 0 531 998 | A2 | 3/1993 |
| EP | 1 533 787 | A1 | 5/2005 |
| EP | 1 732 350 | A1 | 12/2006 |
| EP | 1 737 266 | A1 | 12/2006 |
| EP | 1 868 409 | A1 | 12/2007 |
| EP | 1 868 410 | A1 | 12/2007 |
| EP | 2 003 924 | A1 | 12/2008 |
| WO | WO-03/101147 | A1 | 12/2003 |

OTHER PUBLICATIONS

"The Virtual Loudspeaker Cabinet", KEF White Papers, J.R. Wright, Feb. 2001, 7 pgs.

* cited by examiner

*Primary Examiner* — Forrest M Phillips

(74) *Attorney, Agent, or Firm* — Harrington & Smith

(57) ABSTRACT

An apparatus comprises an agglomeration of adsorbing members, each of the adsorbing members comprising a porous outer layer configured to enclose an amount of adsorbent material, the agglomeration being configured such that every cross-section through the agglomeration comprises at least one gap between adjacent adsorbing members.

22 Claims, 11 Drawing Sheets

ENCLOSING ADSORBENT MATERIAL

FIELD OF THE INVENTION

This invention relates to apparatus comprising an agglomeration of adsorbing members and to using an agglomeration of adsorbing members.

BACKGROUND OF THE INVENTION

The problem of back-to-front cancellation in acoustic devices, such as loudspeakers, has long been known. Such cancellation is due to sound waves produced by the back of the loudspeaker diaphragm destructively interfering with sound waves produced by the front of the loudspeaker diaphragm. The problem is particularly prominent at low (bass) frequencies. One way of reducing the effects of this problem is to house the loudspeaker in an enclosure, thereby containing the interfering sound waves produced by the back of the loudspeaker diaphragm. However, this solution presents problems. One such problem is that gas within the enclosure impedes the movement of the loudspeaker diaphragm. Not only does this reduce the efficiency of the loudspeaker, but also it can negatively affect the bass performance of the loudspeaker. The resonant frequency of a loudspeaker unit is dependent on the moving mass of the driver, and the combination of the impedance to diaphragm movement both due to the air in the enclosure and due to the suspension of the loudspeaker. The impedance of the combination is higher than either impedance individually. Consequently, the resonant frequency of the loudspeaker unit is increased (and the bass performance is decreased) when a loudspeaker is enclosed. One way to reduce the impedance of the air in the enclosure (and thus improve the bass performance of the loudspeaker) is to enlarge the enclosure, for example by introducing a cavity. However, this is particularly undesirable when manufacturing loudspeakers for mobile devices such as mobile phones, PDAs, laptops and the like.

SUMMARY

According to a first aspect, this specification provides an apparatus comprising an agglomeration of adsorbing members, each of the adsorbing members comprising a porous outer layer configured to enclose an amount of adsorbent material, the agglomeration being configured such that every cross-section through the agglomeration comprises at least one gap between adjacent adsorbing members.

According to a second aspect, this specification provides an apparatus comprising an object, for instance a diaphragm, configured to be moved upon application of an electrical signal, a cavity in communication with the object, and an agglomeration of adsorbing members provided in the cavity, wherein each of the adsorbing members comprises a porous outer layer configured to enclose an amount of adsorbent material, the agglomeration being configured such that every cross-section through the agglomeration comprises at least one gap between adjacent adsorbing members.

According to a third aspect, this specification provides a method comprising using an agglomeration of adsorbing members, each of the adsorbing members comprising a porous outer layer configured to enclose an amount of adsorbent material, the agglomeration being configured such that every cross-section through the agglomeration comprises at least one gap between adjacent adsorbing members in an acoustic transducer system.

DETAILED DESCRIPTION OF EMBODIMENTS

Figure 1:
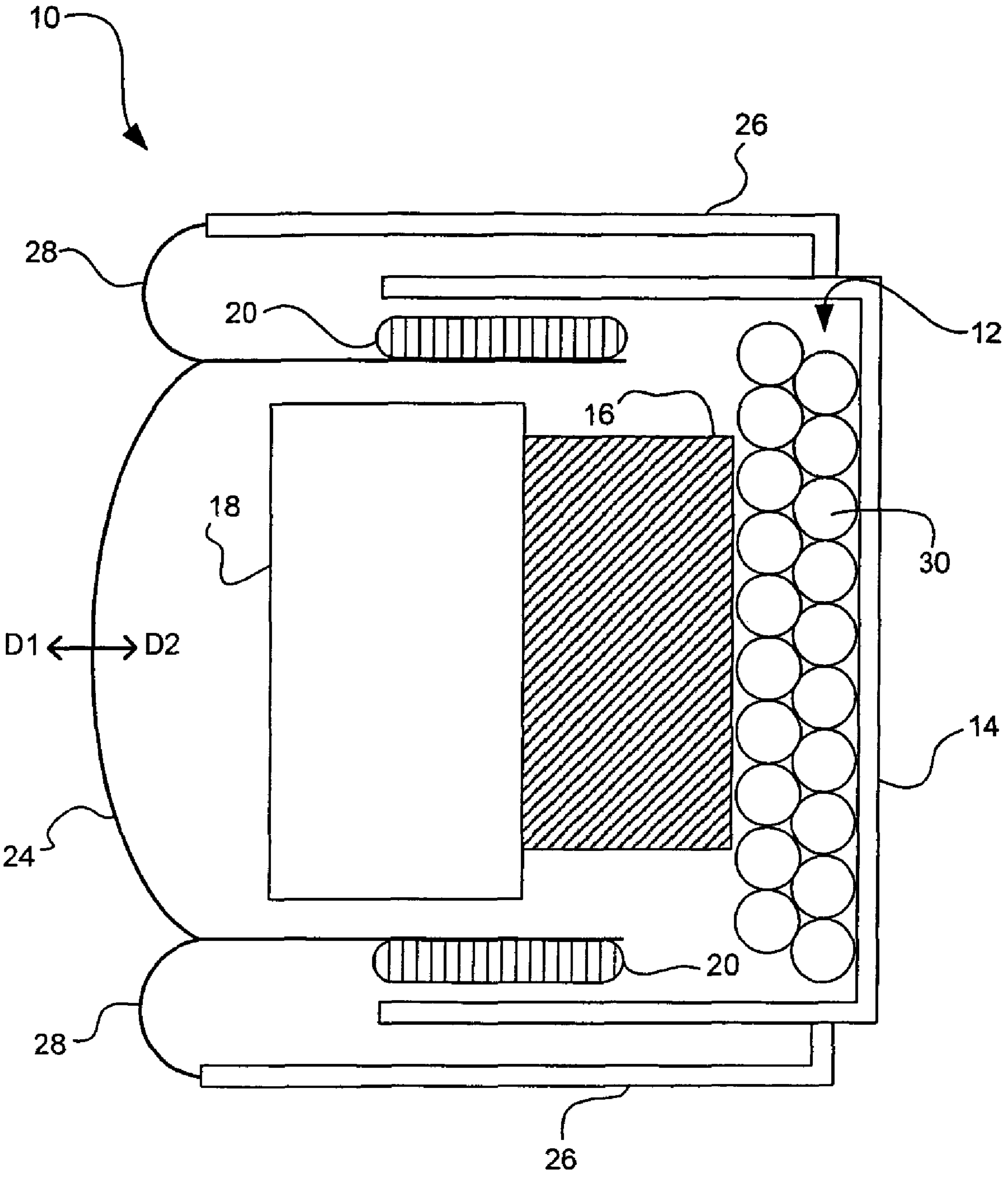
FIG. 1 is a schematic cross-sectional view of an electrodynamic loudspeaker unit including apparatus arranged for compensating for pressure changes in an acoustic transducer system.

In the figures, like reference numerals refer to like elements throughout.

FIG. 1 shows a cross-sectional view of an electrodynamic loudspeaker unit 10 including apparatus 12 for compensating for pressure changes an acoustic device, such as the loudspeaker unit 10. The loudspeaker unit 10 operates to produce sound, or acoustic, energy. The loudspeaker unit 10 comprises a main housing 14, a magnet 16, a pole-piece 18, a coil 20, a cavity 22, and a diaphragm 24. The loudspeaker unit further comprises a support housing 26 surrounding the main housing 14 and a support diaphragm 28 surrounding the diaphragm 24. The cavity 22 is formed between the magnet 16 and the main housing 14. The pressure compensating apparatus 12 is located within the cavity 22.

The pole-piece 18 is in physical connection with the magnet 16 and is thus magnetised. The coil 20 surrounds the pole-piece 18. The diaphragm 24 is fixed to the coil 20. Consequently, when a varying current is passed through the coil 20, the resulting Lorrentz Force on the electrons in the coil 20 causes the coil 20, and thus the diaphragm 24 affixed to the coil 20, to oscillate. This oscillation results in sound being produced by the diaphragm 24.

It will be appreciated that the electrodynamic loudspeaker unit 10 may have a different configuration to that shown in FIG. 1 as long as the apparatus 12 is located suitably within the loudspeaker unit 10. A suitable location is one in which the pressure compensation apparatus 12 is able to compensate sufficiently for pressure changes within the loudspeaker unit 10.

Figure 2:
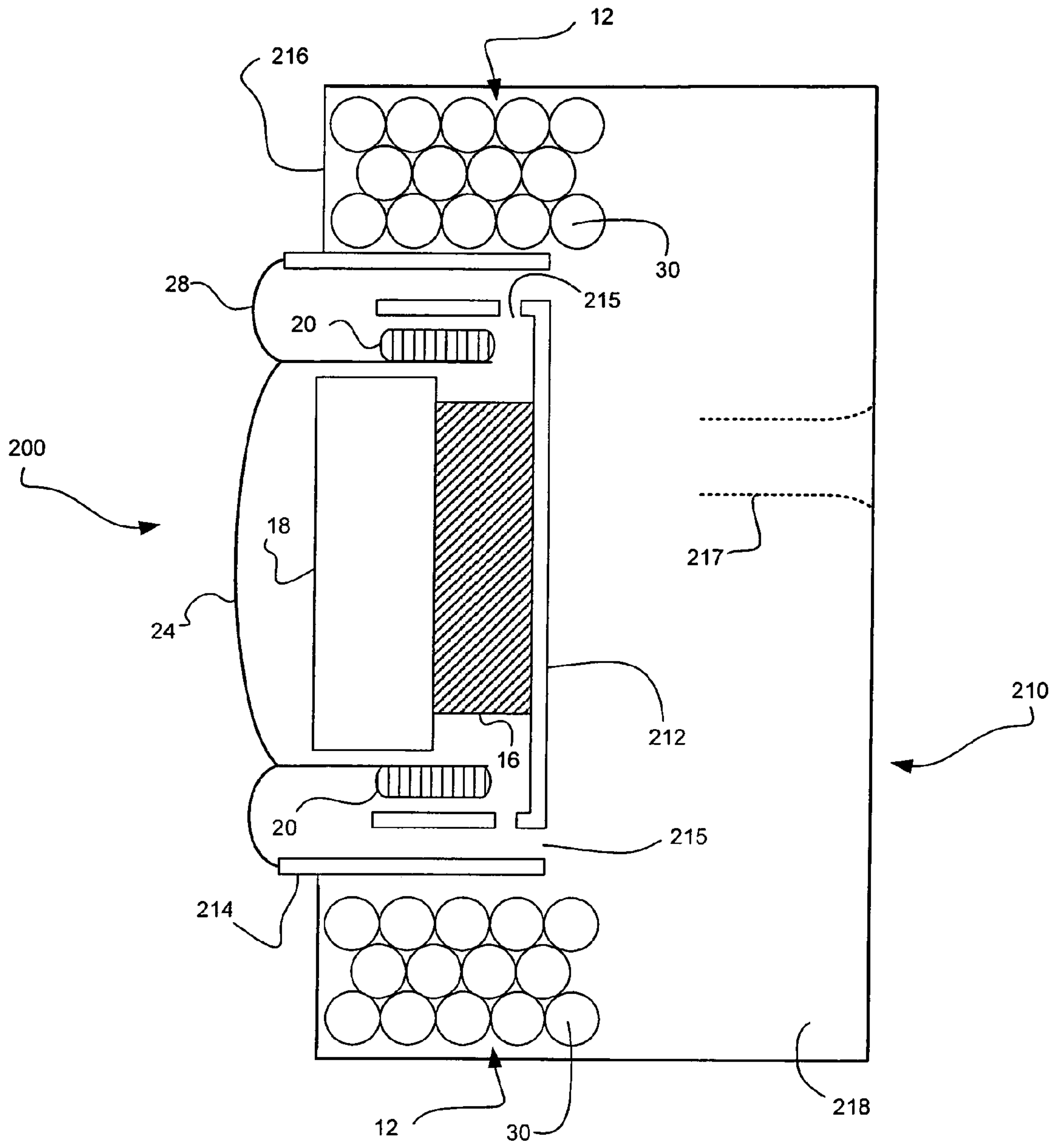
FIG. 2 is a cross-sectional view of a loudspeaker system comprising a loudspeaker unit integrated into a device.

FIG. 1 shows a loudspeaker unit having an integrated cavity. It will be appreciated, however, that other configurations may also be suitable. For example, instead of the loudspeaker unit itself being enclosed to form a cavity, an enclosed cavity may be formed by the combination of an unenclosed loudspeaker unit and a device into which the loudspeaker unit is incorporated. FIG. 2 is a cross-sectional view of an unenclosed loudspeaker unit 200 incorporated into a device 210. The device 210 may be a mobile device, for example, a mobile phone, a PDA, a laptop computer, a GPS receiver, or the like.

The loudspeaker unit 200 of FIG. 2 comprises a magnet 16, a pole-piece 18, a coil 20, and a diaphragm 24. The loudspeaker unit 200 further comprises an inner support structure 212, an outer support structure 214 surrounding the inner support structure 212, and a support diaphragm 28 surrounding the diaphragm 24. The support structures comprise apertures 215 through which air can flow. The support structures 212, 214 and the diaphragms 24, 28 of the loudspeaker unit 200 do not create a sealed volume of air within the loudspeaker unit 200 itself. Consequently, the loudspeaker unit 210 is an unenclosed loudspeaker unit 200, or a rearwardly open loudspeaker unit 200.

The loudspeaker is located within an aperture in the housing 216 of the device 210. The rear of the loudspeaker unit 200 is in communication with the interior 218 of the device 210 in the sense that gasses can flow relatively freely between the interior of the loudspeaker unit and the interior 218 of the device 210. Consequently, a cavity 218 is formed by the interior of the device 218. The interior of the device 210 may include, for example, circuit boards, circuitry, transceivers, batteries, displays and the like. The pressure compensation apparatus 12 is provided within the cavity 218. As long as the apparatus is in communication with the diaphragm, the exact location of the apparatus 12 within the interior of the device may not be important.

Figure 3:
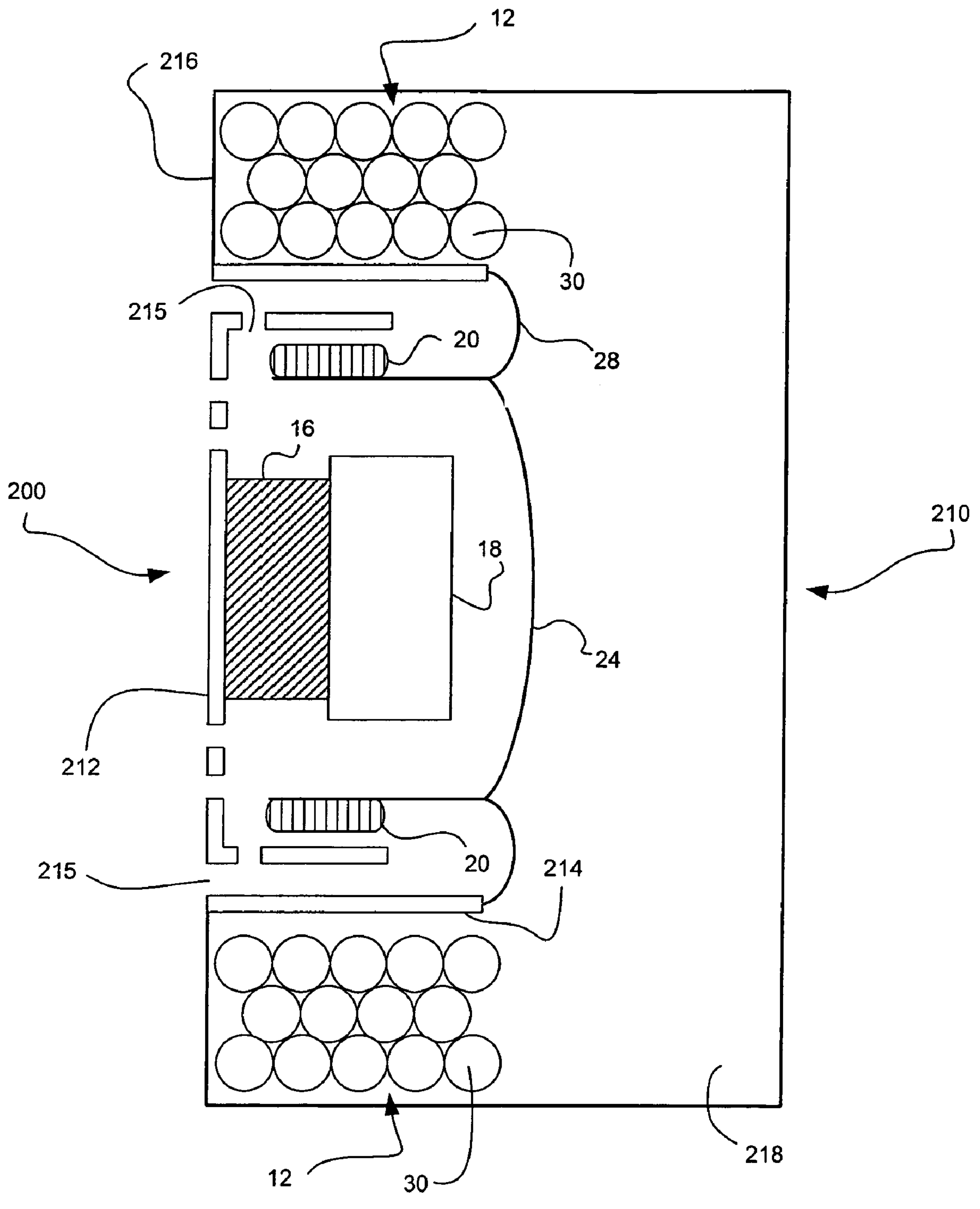
FIG. 3 is a cross-sectional view of an alternative loudspeaker system comprising a loudspeaker unit integrated into a device.

In FIG. 3, the front surface of the diaphragm 24 faces the interior of the device 210. The rear surface of the diaphragm 24, which is opposite the front surface, faces externally. A cavity 218 is formed between the front surface of the diaphragm 24 and the interior surfaces of the device 210. Since the rear of the speaker diaphragm 24 also produces sound energy upon oscillation, this functions similarly to the FIG. 2 arrangement. In FIG. 3, the diaphragm is less exposed to the exterior of the device 210.

The cavities of FIGS. 1, 2 and 3 may be hermetically sealed. Alternatively, the cavities may have a low level of leakage. The level, or amount, of leakage is predetermined, and thus known. The presence of an amount of leakage allows pressure equalisation across the loudspeaker system/unit. The leakage may be provided by a small aperture (not shown) in the housing 14, 26, 216 of the loudspeaker unit 10 or the device 210. The aperture (not shown) may be formed in a surface of the housing. Alternatively, the leakage may result from an intentionally imperfectly sealed joint between two parts of the housing, or between the housing and the loudspeaker unit.

The loudspeaker system of any of the embodiments of this specification may optionally include a bass reflex tube. This may comprise an opening or aperture, formed in the housing of the device 210, having a tube extending therefrom. The tube may be internal or external to the device. The bass reflex tube may act to improve the bass output of the loudspeaker system. FIG. 2 shows, in dashed lines, a bass reflex tube 217 located within the interior of the device 210. The exact size, location, and other characteristics of the bass reflex tube 217 may depend on the design and configuration of the loudspeaker unit 200 and the device 210.

The pressure compensation apparatus 12 shown in FIGS. 1, 2 and 3 comprises a plurality of adsorbing elements or members 30. Although not seen in FIGS. 1, 2 and 3, the plurality of adsorbing elements 30 is arranged in a three-dimensional agglomeration 12 throughout the cavity 22, 218. In the embodiments shown in FIGS. 1, 2 and 3, the adsorbing elements 30 are spherical or approximately spherical. As a result, the three-dimensional agglomeration 12 does not entirely fill the volume of the cavity 22. This and other embodiments of the pressure compensation apparatus are described in detail later in the specification.

Adsorbency is a property of a material that causes molecules, either solid or liquid, to accumulate on the surface of the material. This accumulation (or adsorption) results from Van der Waals interactions between the surface of an adsorbent material and molecules surrounding the adsorbent material. The number of molecules adsorbed depends on both the concentration of molecules surrounding the adsorbent material and the surface area of the adsorbent material. An increase in the concentration of molecules surrounding the adsorbent material results in an increase in the number of molecules adsorbed. Similarly, a larger surface area results in larger number of molecules being adsorbed.

As the loudspeaker diaphragm oscillates to produce sound energy, the pressure of the gas within the cavity 22, 218 of the loudspeaker system fluctuates. As the diaphragm moves towards the magnet 16 and pole-piece 18, the gas pressure in the cavity increases. As the diaphragm moves away from the magnet 16 and pole-piece 18, the gas pressure in the cavity increases. The concentration of molecules is proportional to the gas pressure. The pressure compensation apparatus 12 is operable to compensate for pressure changes within the loudspeaker system/unit by adsorbing more molecules at higher pressure and fewer molecules at lower pressure. In this way, the impedance to the movement of the diaphragm 24, by virtue of the gas pressure within the cavity 22, 218, is reduced. As a result of the reduction in the impedance, less power may be required to drive the diaphragm 24. Consequently, the efficiency of the loudspeaker unit/system may be increased.

Previously, to reduce effective impedance of the diaphragm by air in an enclosed loudspeaker unit, large cavities were required. However, the inclusion of the apparatus 12 into loudspeaker units obviates the need for large cavities, and thus enables the production of smaller loudspeaker units. This is generally desirable in all types of loudspeaker design, and is particularly desirable in loudspeakers designed for mobile devices, such as mobile phones, PDAs, laptop computers and the like.

In the case of mobile devices, such as mobile phones, loudspeaker cavities may be in the range of 0.5 to 1.5 milliliters (0.5 to 1.5 cubic centimeters). This is typically too small to achieve reasonable bass performance. This also constitutes a relatively large proportion of the volume of the mobile device. The inclusion of the pressure compensation apparatus 12 in a loudspeaker unit can allow improved bass performance while also significantly reducing the proportion of the mobile phone taken up by the loudspeaker unit.

Figure 4:
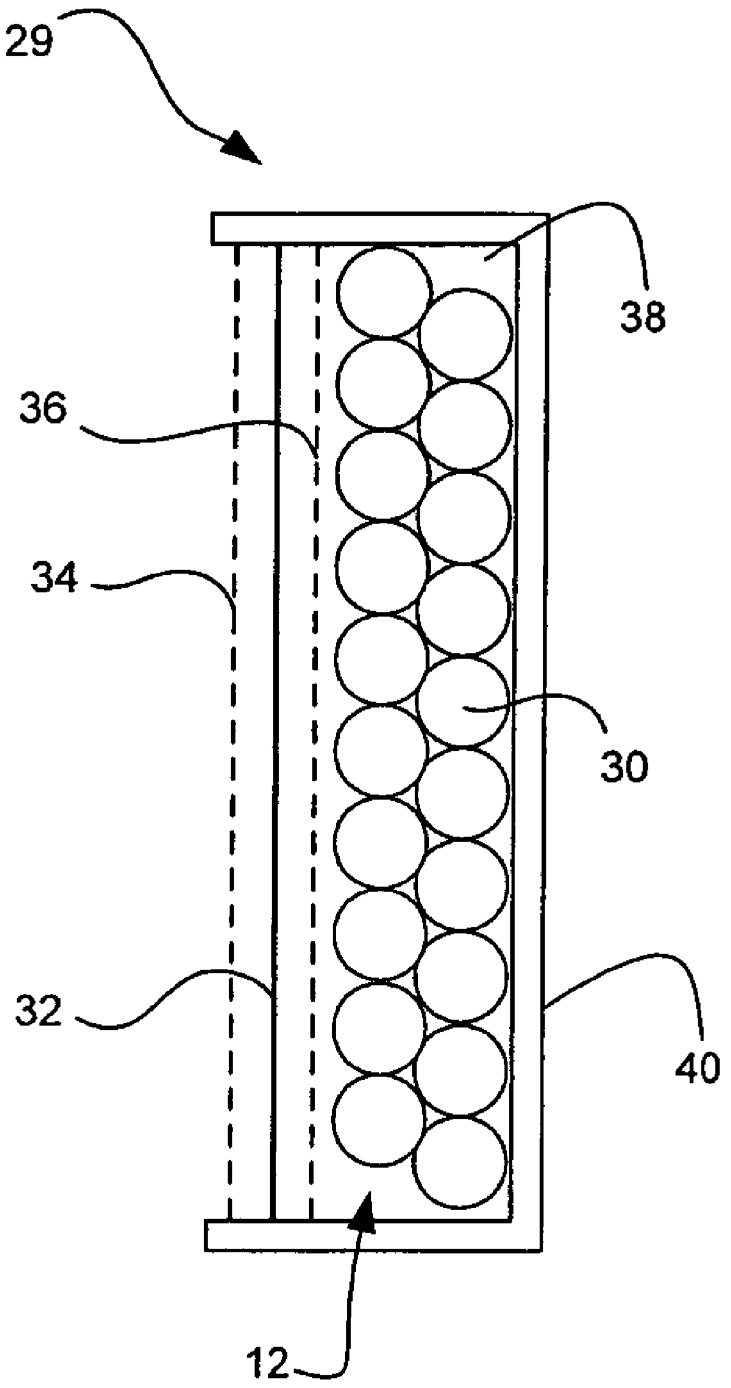
FIG. 4 is a schematic cross-sectional view of an electrostatic loudspeaker unit including apparatus arranged for compensating for pressure changes in an acoustic transducer system.

The pressure compensation apparatus 12 may also provide significant advantages in other loudspeaker types. FIG. 4 shows a cross-sectional view of the pressure compensation apparatus 12 incorporated into a simplified schematic of an electrostatic loudspeaker unit 29.

The electrostatic loudspeaker unit 29 depicted in FIG. 4 comprises a diaphragm 32 located between two electrodes 34 and 36. The electrodes 34 and 36 typically may be perforated metal plates. A cavity 38 is formed between the loudspeaker housing 40 and the diaphragm 32. The apparatus 12 is located within the cavity 38. A suitable location is one wherein the apparatus 12 can compensate for pressure changes in the cavity 38 and also does not interfere with the operation of the diaphragm 32.

It will be appreciated that an electrostatic loudspeaker unit alternatively may not include the housing, and instead may be integrated with a mobile device to form an airtight cavity, in a manner similar to that depicted in FIGS. 2 and 3.

The apparatus 12 may also be used in conjunction with electret speakers (which are similar to electrostatic speakers) and piezoelectric speakers.

Figure 5:
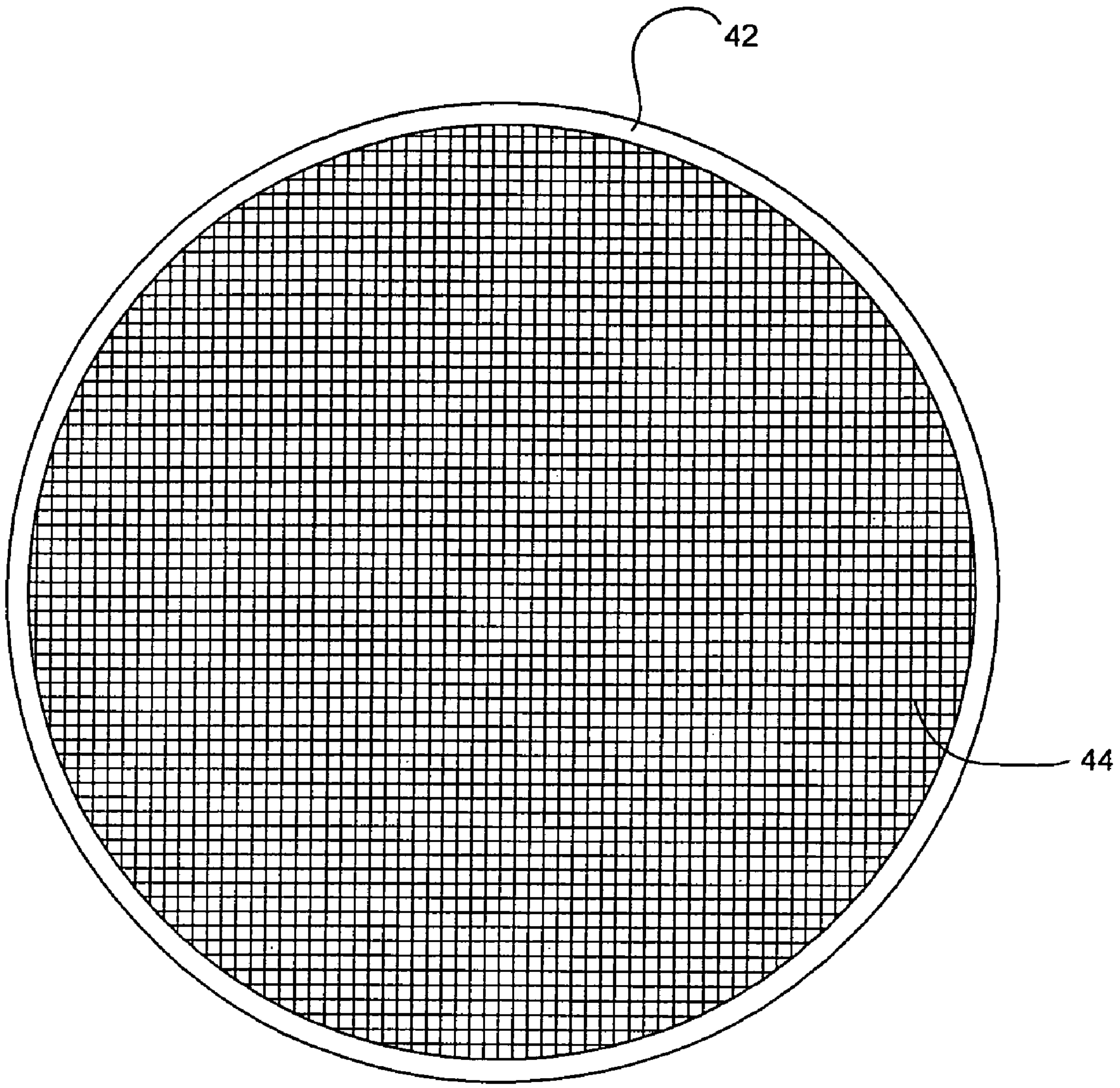
FIG. 5 is a simplified cross-sectional view through one adsorbing member of the apparatus arranged for compensating for pressure changes of FIGS. 1, 2, 3 and 4.

FIG. 5 shows a schematic cross-sectional view through one of the adsorbing members 30 of the pressure compensating apparatus 12. The adsorbing member 30 comprises an outer layer 42 enclosing an amount of adsorbent filling material 44. The outer layer 42 comprises a porous material. As such, fluids, such as gases, may pass through the outer layer 42. In other words, the outer layer is permeable to fluids. Consequently, the adsorbent filling material 44 is able to adsorb gas molecules that pass through the outer layer 42.

The adsorbent filling material 44 may be, for example, a form of activated carbon. Suitable forms of activated carbon include, but are not limited to, powdered activated carbon, granular activated carbon, and fibrous activated carbon. Alternatively, the adsorbent filling material 44 may comprise another type of adsorbent material, for example, silica gel or a zeolite. Alternatively, the adsorbent material may comprise a combination of any of the above-mentioned, or any other, adsorbent materials.

Figure 6:
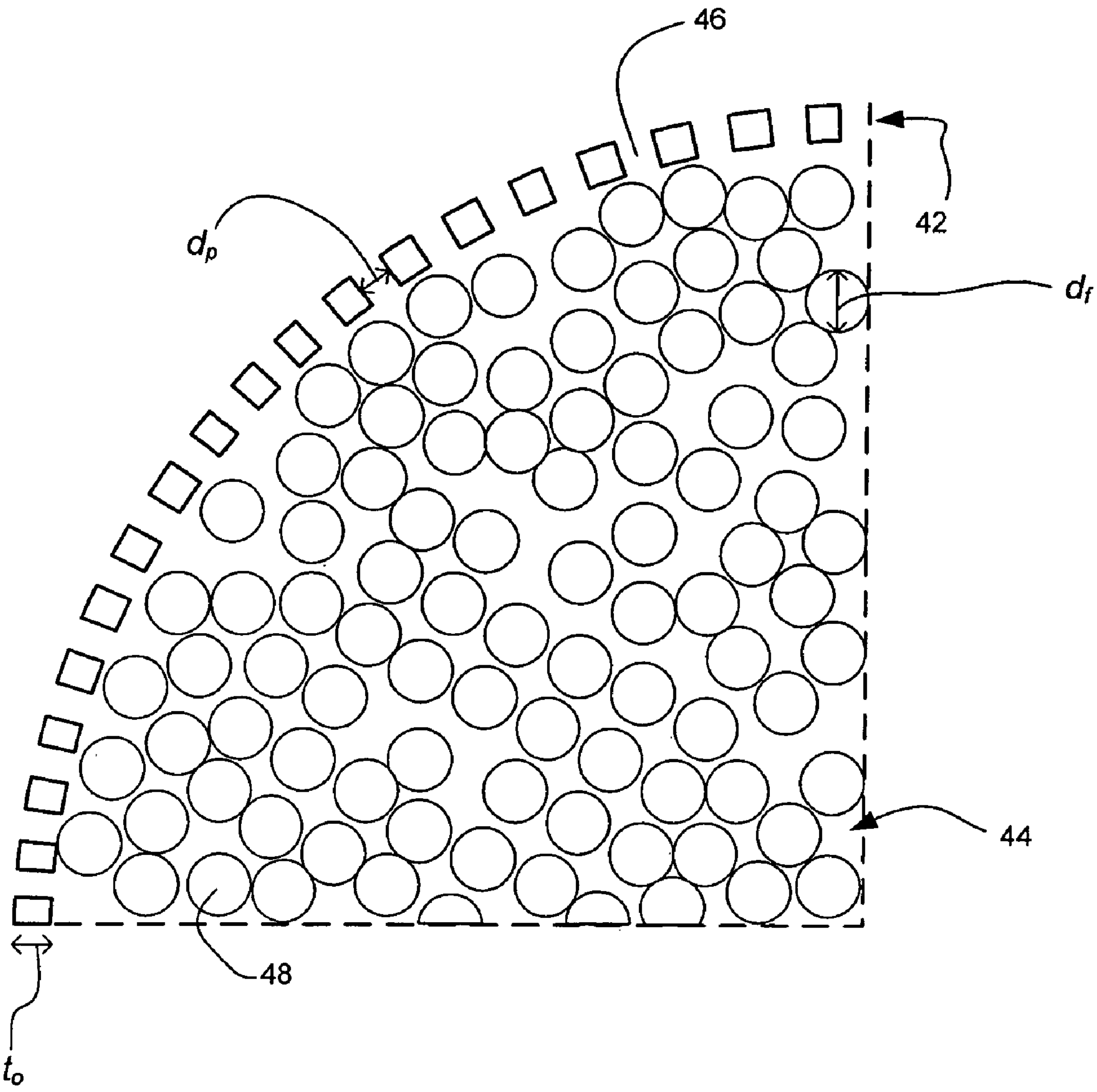
FIG. 6 is a magnified view of a portion of the cross-section of FIG. 5.

FIG. 6 shows a magnified view of a section of the cross-sectional view through the adsorbing member 30 (as shown in FIG. 5). The outer layer 42 of the adsorbing member 30 is porous by virtue of pores 46, or holes or void spaces, in the material. Gases permeate through the outer layer 42 by passing through the pores 46. The diameters $d_p$ of the pores 46 in the material constituting the outer layer 42 are smaller than the diameters $d_f$ of the smallest of the particles, granules or fibres 48 that constitute the filling material 44. As such, no appreciable amount of filling material 44 can pass through the pores 46 of the outer layer 42. Consequently, the particles, granules or fibres 48 of the filling material 44 may not adversely affect the performance of the loudspeaker by escaping into areas in which they are not desired, such as the mechanism of the loudspeaker.

The sizes of the pores, the spatial density of the pores 46 (i.e. the number of pores per unit area), the thickness $t_0$ of the outer layer 42 and the material of the outer layer 42 are also selected so as to ensure that the activated carbon is electrically isolated from the other components of the loudspeaker 10. This reduces the possibility of corrosion of any metal parts of the loudspeaker due to electrical contact with the activated carbon.

The sizes of the pores 46, the spatial density of the pores 46, the thickness $t_0$ of the outer layer 42 and the material of the outer layer 42 are also selected so as to restrict the passage of extraneous and unwanted substances through the outer layer. These extraneous substances include, for example, water and dust. The presence of these substances within the adsorbing members may reduce the adsorbency of the filling material, and thereby may reduce the effectiveness of the pressure compensation apparatus 12, and for this reason it is desirable to restrict their access through the outer layer.

Granular activated carbon for example, may have a minimum particle diameter $d_f$ of 0.2 mm. Consequently, in embodiments of the pressure compensation apparatus 12 in which granular activated carbon is the adsorbing filing material 44, the diameters $d_p$ of the pores 46 of the outer layer 42 may be smaller than 0.2 mm. For example, the diameter $d_p$ of the pores may be in the range of 2 μm to 50 μm. The diameter $d_p$ of the pores instead may be in the range of 10 μm to 40 μm The spatial density of the pores 46 may be, for example, in the range of 100-62,500 pores/mm$^2$. The spatial density of the pores instead may be in the range 200 to 2500 pores/mm$^2$. The thickness $t_0$ of the outer layer may be, for example, in the range of 0.05 mm to 0.15 mm.

The outer layer 42 may be comprised of a woven fabric, such as a fine polyester mesh. A woven fabric may allow the pore size $d_p$ to be precisely selected and controlled. Alternatively, an unwoven porous material, such as the membrane layer used in Gore-Tex® may be used. The outer layer 42 may be treated to be hydrophobic. As such the outer layer 42 may repel water. The treatment may be carried out in any suitable manner. The outer layer 42 may be flexible. Alternatively, the outer layer 42 may be rigid. The shape of the outer layer 42 may substantially define the shape of the adsorbing member 30. The adsorbing members 30 may have a diameter in the range of, for example, 0.5 mm to 10 mm. The adsorbing members instead may have a diameter in the range of 2 mm to 5 mm.

The pressure compensation apparatus 12 comprises a plurality of adsorbing members 30. In the embodiments of FIGS. 1 to 4, the adsorbing members are substantially spherical. In FIGS. 1 to 4, the adsorbing members 30 are arranged in a regular way. However, it will be appreciated that, although a regular arrangement may provide the highest adsorbing member density (that is the greatest number of adsorbing members/m$^3$), any regular or irregular arrangement or agglomeration may be suitable.

In the arrangements of FIGS. 1 to 4, the pressure compensation apparatus 12 comprises two layers of adsorbing members 30. It will be appreciated, however, that the number of layers may vary depending on the diameters of the adsorbing members 30, the size of the cavity 22;38, and the desired adsorbency of the apparatus 12.

Figure 7:
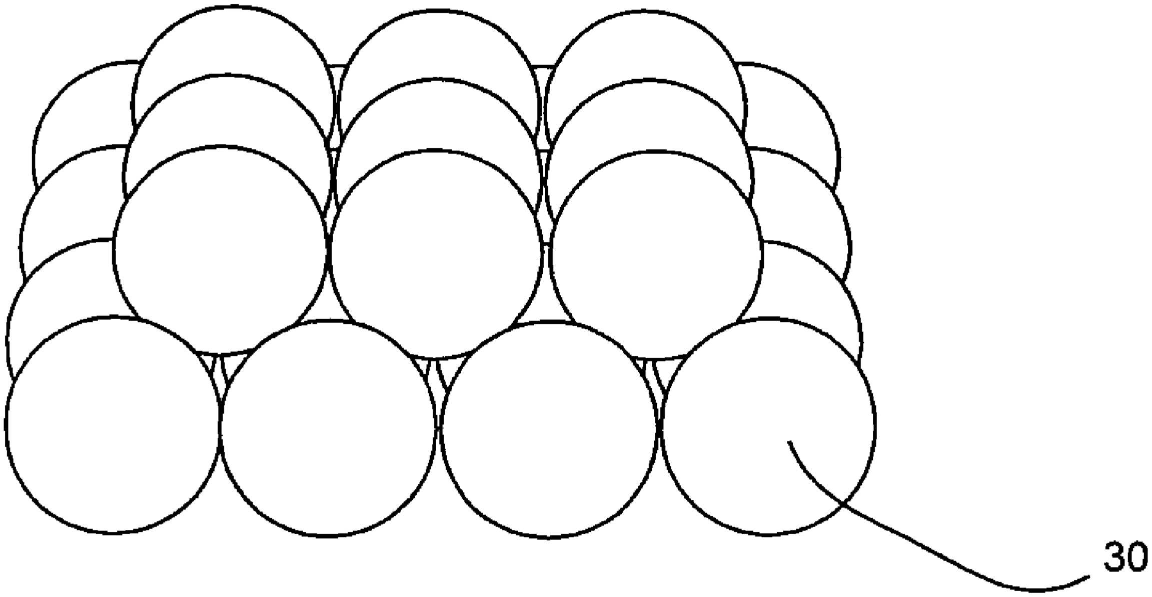
FIG. 7 is a three-dimensional view of a portion of the apparatus arranged for compensating for pressure changes of FIGS. 1, 2, 3 and 4.

FIG. 7 is a three-dimensional perspective view of a portion of the adsorbing members 30 of the pressure compensation apparatus 12 of FIGS. 1 to 4. Each of the two layers of adsorbing members 30 is arranged in a square array, wherein each adsorbing member 30 has four nearest neighbours. The second layer (the upper layer) is translated from the first (the bottom layer) such that each of the adsorbing members 30 of the second layer is located in a hollow formed by four adsorbing members 30 from the first layer. In other embodiments, each of the two layers of adsorbing members 30 is arranged in a triangular array. Here, an adsorbing member 30 has six nearest neighbours. The second layer (the upper layer) is translated from the first (the bottom layer) such that each of the adsorbing members 30 of the second layer is located in a hollow formed by three adsorbing members 30 from the first layer.

Figure 8A:
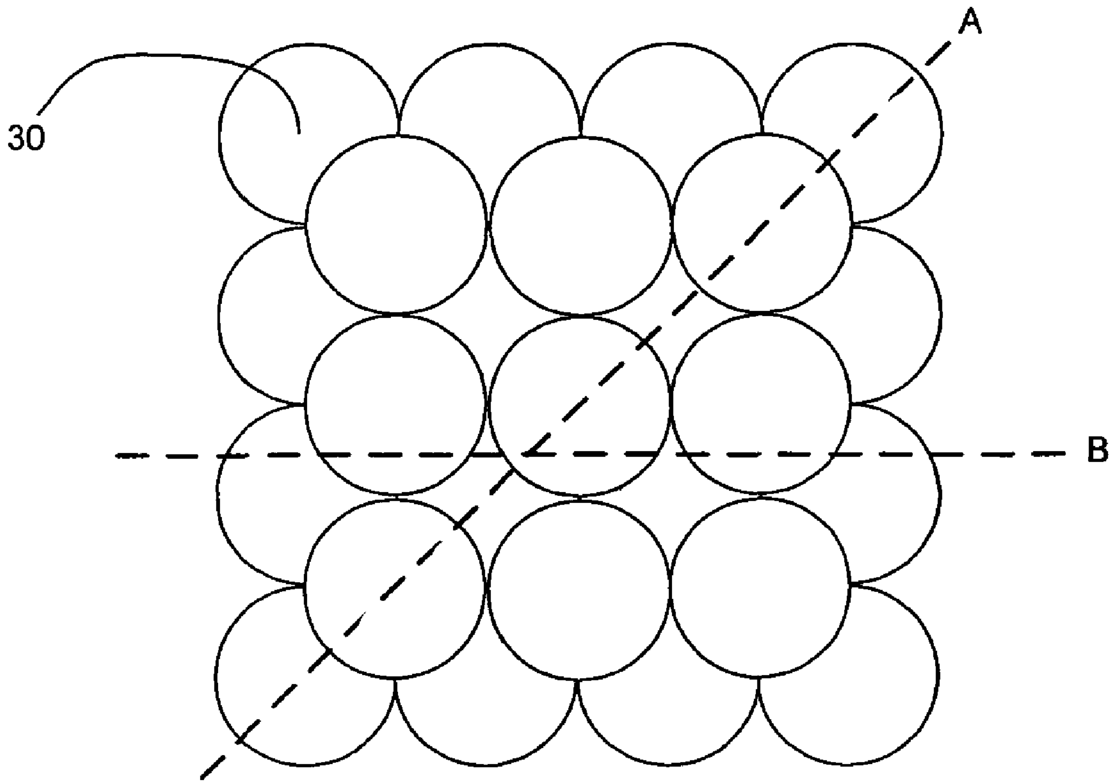
FIGS. 8A and 8B are a plan-view and a side-view respectively of the portion of the apparatus arranged for compensating for pressure changes of FIG. 7.
Figure 8B:
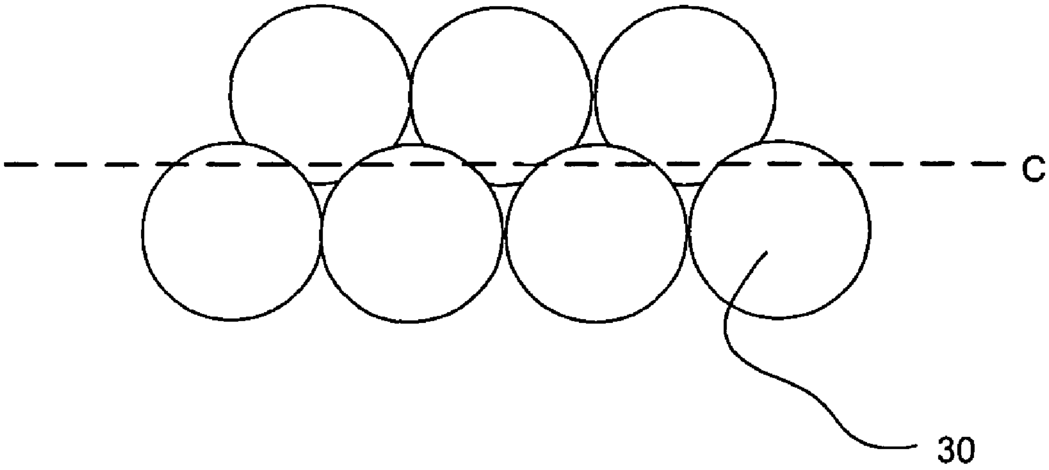

FIGS. 8A and 8B show a plan view and side-view respectively of the portion of the pressure compensation apparatus 12 shown in FIG. 7.

Figure 9A:
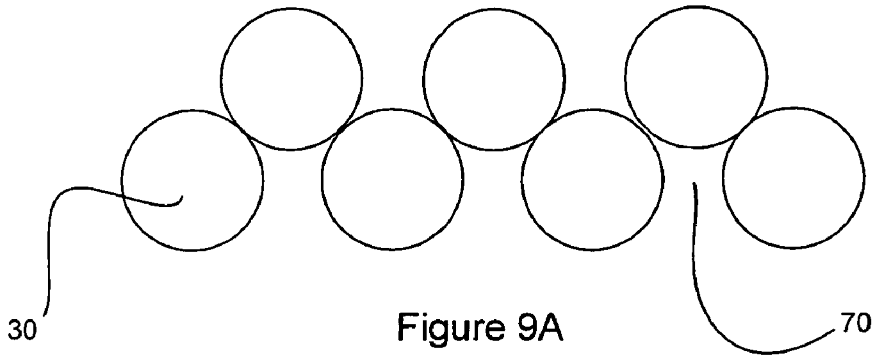
FIGS. 9A, 9B and 9C are cross-sectional views through the portion of the apparatus arranged for compensating for pressure changes of FIGS. 7 and 8.
Figure 9B:
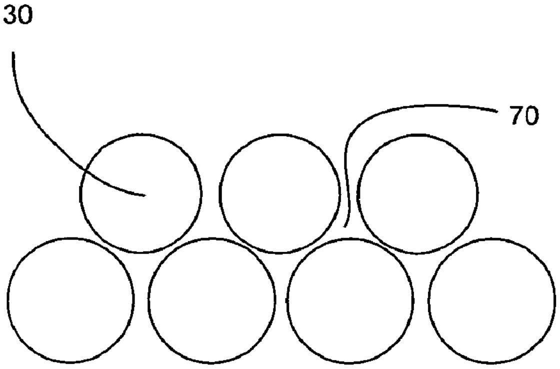
Figure 9C:
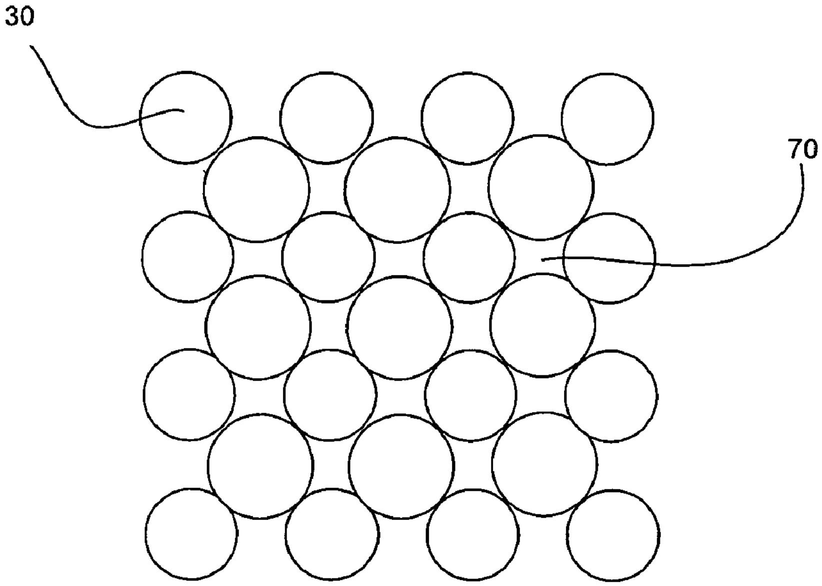

FIG. 9A shows the cross section through the portion of the pressure compensation apparatus 12 at the dashed line A shown in FIG. 8A. FIG. 9B shows the cross section through the portion of the pressure compensation apparatus 12 at the dashed line B shown in FIG. 8A. FIG. 9C shows the cross section through the portion of the pressure compensation apparatus 12 at the dashed line C shown in FIG. 8B.

Each of the cross-sections of FIGS. 9A to 9C comprise regions filled by adsorbing members 30, and also comprise vacated regions or gaps 70, which are not filled by adsorbing members 30. Although the cross-sections of FIGS. 9A to 9C are only three exemplary cross-sections through the arrangement of adsorbing members 30, it will be appreciated that, because of the substantially spherical shape of the adsorbing members 30, every possible cross-section through the arrangement of adsorbing members comprises both regions filled by adsorbing members 30 and gaps 70. As such, there is no cross-section through the pressure compensation apparatus through which air is unable to flow.

It will be understood also that every possible arrangement or agglomeration of a plurality of substantially spherical adsorbing members exhibits the property that any cross section through the agglomeration comprises at least one gap.

It will be understood also that these gaps 70 join up throughout the entire arrangement to form a three-dimensional 'maze' of vacated regions. Consequently, every vacated region in the arrangement of adsorbing members is connected directly or indirectly with every other vacant region. Consequently, air is able to flow with relatively little resistance throughout the pressure compensation apparatus. As such the air can relatively easily reach all parts of the loudspeaker cavity 22. This results in reduced acoustic damping when compared with pressure compensation apparatus throughout which air cannot easily flow, such as a single adsorbing member filling the whole or most of the cavity 22, 218. Also, the use of a pressure compensation apparatus comprising a plurality of smaller adsorbing members 30, instead of just a single larger member, means that the apparatus need not be custom-made to fit into a particular cavity shape. Instead, the plural adsorbing members 30 may be utilised in conjunction with any cavity shape.

Because any possible agglomeration of adsorbing members 30 comprises a 'maze' of vacant regions, the adsorbing members 30 may not require precise arrangement when being placed within the cavity 22. However, precise arrangement of the adsorbing members 30 may allow more adsorbing members 30 to be placed within the cavity 22.

As mentioned above, the maximum diameter $d_p$ of the pores in the outer layer 42 of the adsorbing members 30 is limited by the size of the particles of the adsorbing filling material 44. The maximum diameter $d_p$ of the pores in the outer layer 42 of the adsorbing members 30 is limited also by the requirement of water resistance for the outer layer 42. Large pores would reduce the flow resistance of air flowing into the adsorbing members, and thereby increase the 'acoustic transparency' of the adsorbing members. However, large pores would also reduce the water resistance of the outer layer 42.

However, the pressure compensation apparatus 12 comprises plural adsorbing members 30. As such, the overall surface area of the outer layers of the pressure compensation apparatus 12 is relatively high. Consequently, despite the pore diameter being relatively small so as to allow high water resistance and high filling material retention, the total area of the pores in the pressure compensation apparatus is relatively high. As such, the presence of a relatively large number of adsorbing members 30 compensates for the relatively high flow resistance arising from small pore diameter $d_p$.

The adsorbing members 30 may be arranged loosely in the cavity. Alternatively, they may be constrained in some way. For example, the number of adsorbing members in the cavity may result in the adsorbing members being wedged or packed into position and unable to move. Alternatively, the adsorbing members may be located in a highly porous container or bag to prevent the adsorbing members from escaping. The container or bag may be fixed to an interior surface of the cavity.

In the pressure compensation apparatus depicted in FIGS. 1 to 4, 7 and 8, each of the adsorbing members 30 has the same diameter. Alternatively, the adsorbing members that constitute a pressure compensation apparatus may have varied diameters. For example, adsorbing members having relatively large diameters may be located in relatively large parts of the cavity and adsorbing members having smaller diameters may be situated in smaller parts of the cavity.

Figure 10:
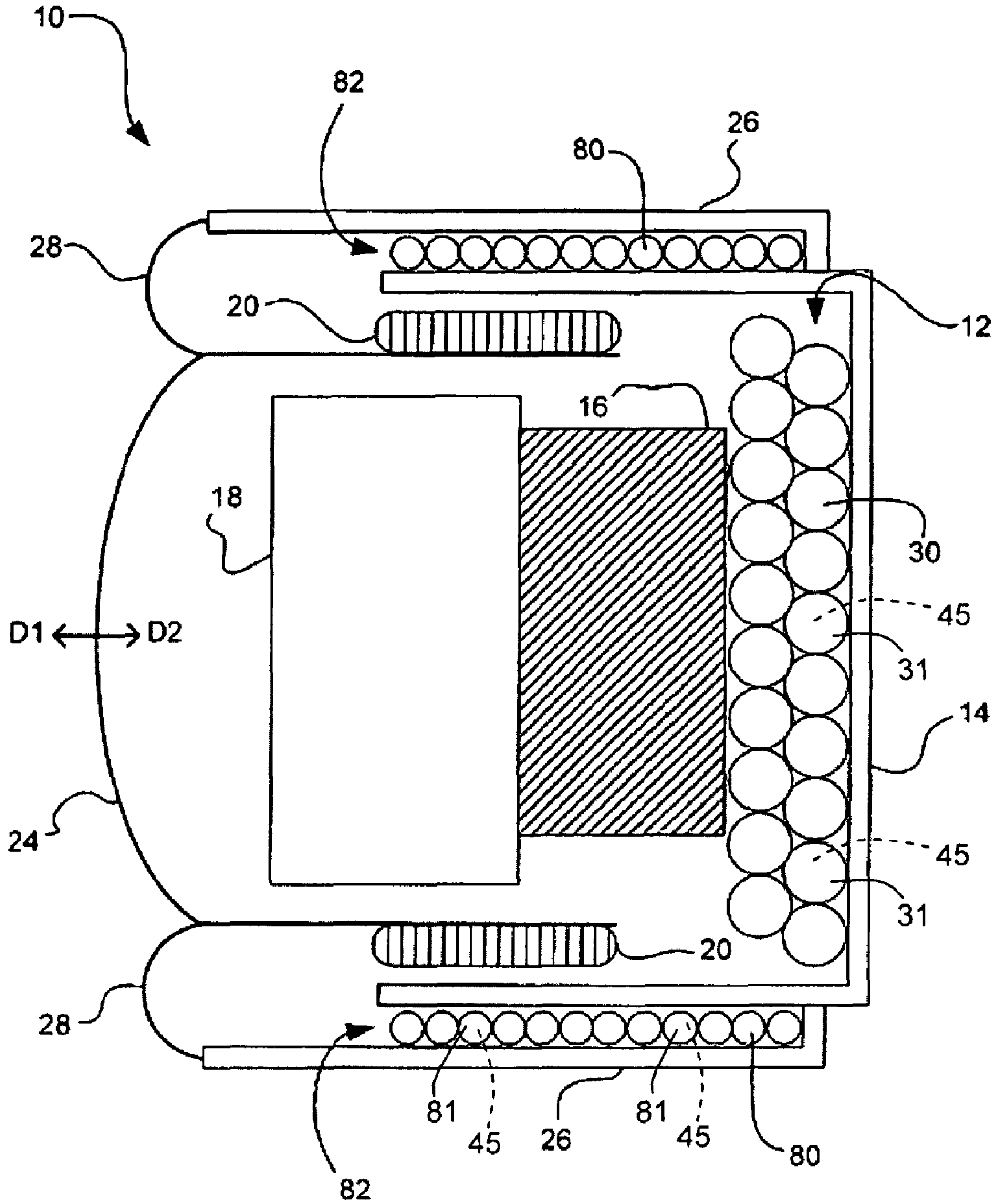
FIG. 10 shows an electrodynamic loudspeaker unit including an alternative embodiment of an apparatus arranged for compensating for pressure changes in an acoustic transducer system.

FIG. 10 shows a loudspeaker similar to that of FIG. 1. The loudspeaker 10 additionally includes adsorbing members 80 located in a cavity 82 formed between the support housing 26 and the main housing 14. The adsorbing members 80 have a smaller diameter than the adsorbing members 30 located in the main cavity 22. Consequently, they are able to fit in the cavity 82 formed between the support housing 26 and the main housing 14.

In the embodiments described above, the adsorbing members 30, 80 are substantially spherical in shape. It will be appreciated, however, that the adsorbing members may have another shape as long as any cross-section through any agglomeration of the adsorbing members comprises at least one gap. An example of such a shape is an ellipsoid.

In other embodiments, the adsorbing members are differently shaped. For instance, they may be pillow shaped. Pillow shapes are particularly easy to form because they can comprise only one or two parts. Two part pillows are joined together at their edges, and one part pillows can be folded over and the meeting edges joined. The absorbing members could instead be generally cylindrical.

Whatever the shape of the adsorbing members, they may be constructed in any suitable manner. Edges of parts forming the outer layer when completed may be joined to other parts in any suitable way, for instance using ultrasonic welding.

In some embodiments the plurality of adsorbing members that constitutes the pressure compensation apparatus include adsorbing members having different shapes. For example, a pressure compensation apparatus may comprise substantially spherical adsorbing members and substantially ellipsoidal adsorbing members.

In some embodiments the plurality of adsorbing members that constitutes a pressure compensation apparatus include adsorbing members having different sizes. For example, a pressure compensation apparatus may comprise substantially spherical adsorbing members of two different sizes. The substantially spherical adsorbing members may be arranged in a specific configuration selected to have a high density of members. Alternatively, the substantially spherical members may be randomly arranged.

In some embodiments, the plurality of adsorbing members that constitutes a pressure compensation apparatus include adsorbing members having different sizes and different shapes.

In some embodiments, the pressure compensation apparatus includes also blank members 31, 81 (see FIG. 10). The blank members 31, 81 may be filled with a non-adsorbent filling material 45. Alternatively, the blank members 31, 81 may comprise single solid members, and not an outer layer and a filling material. The blank members 31, 81 are substantially non-adsorbent. The blank members 31, 81 may be the same shape and size as the adsorbing members 30, 80. Alternatively, the blank members 31, 81 may have a different size and/or a different shape to the adsorbing members 30, 80. The provision of blank members throughout the agglomeration of adsorbing members 30, 80 may allow the ratio of total adsorbency of the apparatus to air-flow resistance caused by the apparatus within the cavity to take a desired ratio.

Figure 11A:
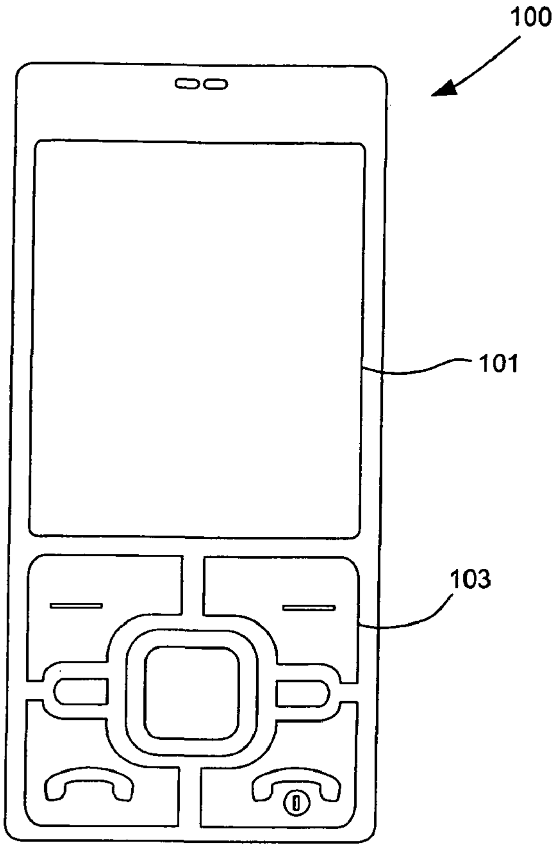
FIGS. 11A and 11B are simplified schematic front and rear views respectively of a mobile terminal comprising a loudspeaker system as shown in any of FIGS. 1 to 4 and 10.
Figure 11B:
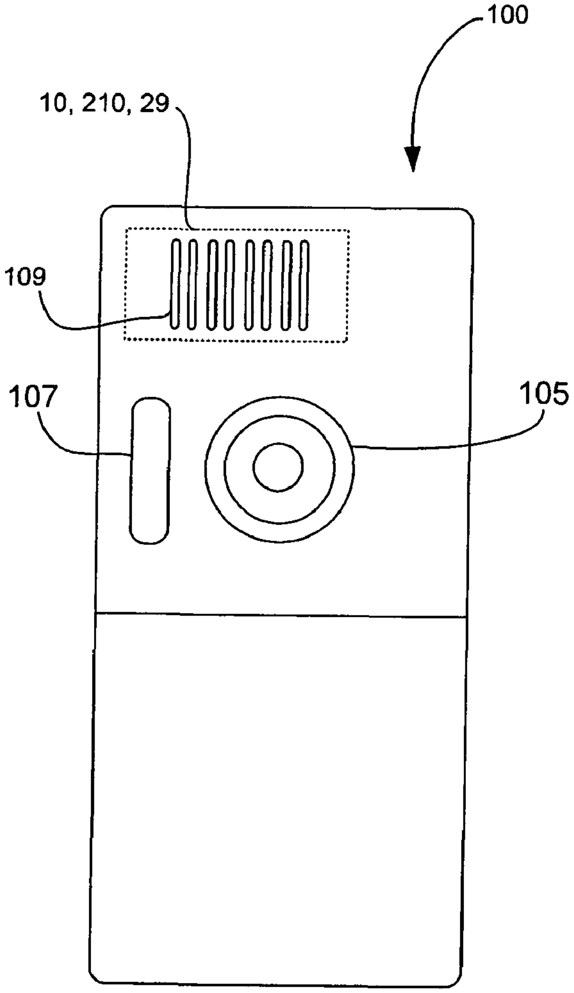

FIGS. 11A and 11B are a front view and a rear view respectively of a mobile terminal 100 comprising a loudspeaker system 10, 210, 29 according to any of the above described embodiments. The mobile terminal also comprises a display 101, a keypad 103, a camera 105, and a camera flash 107. Although not shown, it will be understood that the mobile terminal also may comprise a transceiver, an antenna, a battery etc. In FIG. 11, the loudspeaker unit 10, 210, 29 is in communication with openings 109 formed on the rear side of the device 100. However, it will be appreciated that the loudspeaker unit 10, 210, 29 instead may be in communication with openings or an opening formed on the front side of the device 100.

It should be realised that the foregoing embodiments should not be construed as limiting. Other variations and modifications will be apparent to persons skilled in the art upon reading the present application. Moreover, the disclosure of the present application should be understood to include any novel features or any novel combination of features either explicitly or implicitly disclosed herein or any generalisation thereof and during the prosecution of the present application or of any application derived therefrom, new claims may be formulated to cover any such features and/or combination of such features.

The invention claimed is:

1. An apparatus comprising an agglomeration of adsorbing members, wherein each of the adsorbing members comprises a porous outer layer, wherein the porous outer layer is electrically insulating, the agglomeration being configured such that the agglomeration comprises at least one gap between adjacent adsorbing members wherein air is able to flow throughout said adjacent adsorbing members, and wherein the apparatus is an acoustic transducer system.

2. An apparatus as claimed in claim 1, wherein the porous outer layer of the adsorbing members is hydrophobic.

3. An apparatus as claimed in claim 1, wherein each of the plurality of adsorbing members is substantially spherical.

4. An apparatus as claimed in claim 1, wherein the plurality of adsorbing members are substantially identical.

5. An apparatus as claimed in claim 1, wherein different ones of the plurality of adsorbing members are differently sized.

6. Apparatus as claimed in claim 1, wherein pores in the porous outer layer have diameters in the range of 2 μm to 50 μm.

7. Apparatus as claimed in claim 1, wherein the adsorbing members have diameters in the range 0.5 mm to 10 mm.

8. An apparatus as claimed in claim 1, wherein the plurality of adsorbing members are located in a porous container.

9. An apparatus as claimed in claim 1, further comprising at least one blank member within the agglomeration of adsorbing members, wherein the blank member comprises non-adsorbent filling material, and wherein the at least one blank member comprises a size and shape substantially the same as each of the adsorbing members.

10. An apparatus as claimed in claim 1 wherein each of the adsorbing members comprises adsorbent filling material, and wherein the porous outer layer is sized and shaped to electrically isolate the adsorbent filling material from components of the acoustic transducer system.

11. An apparatus as claimed in claim 1 wherein the adsorbing members are arranged in layers with substantially symmetrically spaced gaps between the adsorbing members.

12. An apparatus comprising:

an object, for instance a diaphragm, configured to be moved upon application of an electrical signal;

a cavity in communication with the object; and an agglomeration of adsorbing members provided in the cavity, wherein each of the adsorbing members comprises a porous outer layer, wherein the porous outer layer is electrically insulating, wherein the adsorbing members are provided in the cavity with only a plurality of vacant regions therebetween, the agglomeration being configured such that cross-sections through the agglomeration comprise at least one of the plurality of vacant regions between adjacent adsorbing members, and wherein the apparatus is an acoustic transducer system.

13. An apparatus as claimed in claim 12, wherein the porous outer layer of the adsorbing members is hydrophobic.

14. An apparatus as claimed in claim 12, wherein each of the plurality of adsorbing members is substantially spherical.

15. An apparatus as claimed in claim 12, wherein the plurality of adsorbing members are substantially identical.

16. An apparatus as claimed in claim 12, wherein different ones of the plurality of adsorbing members are differently sized.

17. Apparatus as claimed in claim 12, wherein pores in the porous outer layer have diameters in the range of 2 μm to 50 μm.

18. Apparatus as claimed in claim 12, wherein the adsorbing members have diameters in the range 0.5 mm to 10 mm.

19. A mobile device comprising:

an apparatus as claimed in claim 12.

20. An apparatus as claimed in claim 12, wherein the adsorbing members are substantially symmetrically arranged in the cavity.

21. An apparatus as claimed in claim 12 wherein the vacant regions are substantially symmetrically arranged.

22. A method comprising, using an agglomeration of adsorbing members, each of the adsorbing members comprising a porous outer layer, the agglomeration being configured such that the agglomeration comprises at least one gap between adjacent adsorbing members in an acoustic transducer system, wherein the adsorbing members are arranged in substantially symmetrical layers configured to allow air to flow therethrough and configured to reduce acoustic damping, and wherein the porous outer layer of one of the adsorbing members contacts the porous outer layer of another adjacent one of the adsorbing members.

* * * * *